United States Patent [19]

Yoshida

[11] Patent Number: 5,140,557
[45] Date of Patent: Aug. 18, 1992

[54] STATIC RANDOM ACCESS MEMORY OF AN ENERGY-SAVING TYPE

[75] Inventor: Makoto Yoshida, Nara, Japan

[73] Assignee: Sharp Kabushiki Kaisha, Osaka, Japan

[21] Appl. No.: 580,385

[22] Filed: Sep. 11, 1990

[30] Foreign Application Priority Data

Sep. 13, 1989 [JP] Japan .................. 1-238124

[51] Int. Cl.⁵ .............................................. G11C 7/00
[52] U.S. Cl. ..................... 365/226; 365/227; 365/189.09
[58] Field of Search ............... 365/226, 227, 228, 229, 365/189.09

[56] References Cited

U.S. PATENT DOCUMENTS 4,482,985 11/1984 Itoh et al. ........................... 365/226

Primary Examiner—Joseph A. Popek

[57] ABSTRACT

In a static random access memory for storing data in a plurality of memory cells constituting a memory cell array to which a specified electric current for activating each memory cell is supplied from a power source via a path, a P-channel MOSFET is provided as a switch on the path between the power source and the memory cell array. When reading or writing of data in memory cells is performed, the switch is turned on and a specified electric current for activating the memory cells is supplied to the memory cell via the path having the switch. Between the power source and the memory cell array is also provided an electric resistor connected in parallel with the switch. During a stand-by state of the memory cell array, the switch is turned off so that the above path is cut off, and a voltage of the power source is applied through the resistor to the memory cells. Consequently, the electric current supplied to the memory cells becomes smaller than when the electric current flows via the above path, whereby consumption of electricity is suppressed.

3 Claims, 2 Drawing Sheets

STATIC RANDOM ACCESS MEMORY OF AN ENERGY-SAVING TYPE

BACKGROUND OF THE INVENTION

This invention relates to a static random access memory of a volatile type, which is suitable for use especially in portable electronic devices where power supply is limited.

In a conventional static random access memory (RAM), a power source, which is connected to a memory cell array constituted from a plurality of memory cells, supplies an electric current of a specified amount to the memory cell array at all times. The current is supplied not only when the RAM is in an active state where reading or writing of data in the memory cells is carried out, but also when the RAM is in a stand-by state wherein data in the memory cells are held without any change.

Generally, in static RAMs, an electric current necessary for the holding of data in a memory cell is smaller than the electric current necessary for reading or writing of data in the memory cell.

In the above conventional static RAM, however, the electric current is used as much in the stand-by state as in the active state, as stated above. In other words, the conventional RAM wastes electricity. Therefore, if the conventional RAM is used in an electronic device such as a portable device where a power source has a limited life or capacity, it is very difficult to hold data for a long time.

SUMMARY OF THE INVENTION

It is an object of the present invention to provide a static RAM which can reduce consumption of electricity to a minimum in the stand-by state, thereby holding data for a long time even when an electric power source has a limited life as in a portable electronic device.

In order to accomplish the above object, according to the present invention, in a static RAM for storing data in a plurality of memory cells constituting a memory cell array to which a specified electric current is supplied from a power source via a path, a switch is provided on the path between the power source and the memory cell array for enabling cut-off of the path when the memory is in a stand-by state, and an electric resistor is connected in parallel with the switch between the power source and the memory cell array, so that when the path is cut off, the electric current flows to the memory cell array via the electric resistance.

A description for the operation of the static RAM of the above construction follows.

When the memory cell array is required to be activated, the switch is turned on so that a voltage of the power source is applied directly to the memory cell array and that an electric current to activate each memory cell is applied to the memory cell array via the path having the switch and the path having the resistor. As a result, reading or writing of data is carried out in a similar manner as in the conventional static RAM.

When the memory cell array is not required to be activated, that is, when the memory is in a stand-by state, the switch is turned off and the above path is cut off. As a result, the electric current is supplied to the memory cell array via the other path having the resistor. Under this condition, a voltage drop occurs due to the resistor, resulting in that the electric current supplied to the memory cell array, becomes smaller. Therefore, if the electric resistor is adjusted to a suitable value, the memory cells in the stand-by state can hold data with a minimum electric current. Consumption of electricity is thus decreased to a minimum. Therefore, even though the power source has a limited life, a long-period of data holding in the memory cells is realized.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
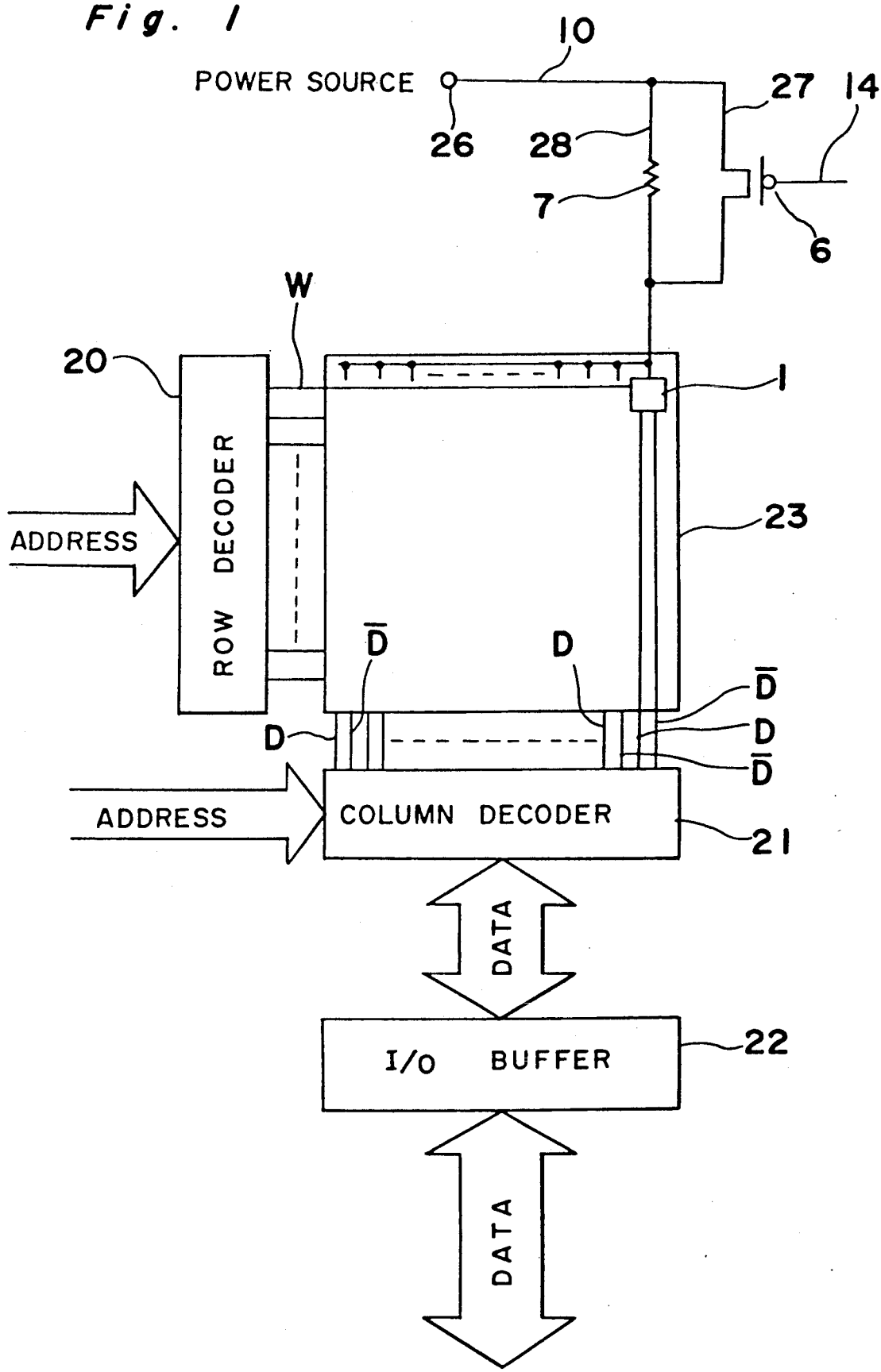
FIG. 1 is a block diagram of a static RAM according to an embodiment of the present invention.

A block diagram of a static RAM of an embodiment of the present invention is shown in FIG. 1. The static RAM includes a row decoder 20, a column decoder 21, an I/O buffer 22 and a memory cell array 23 constituted of a plurality of memory cells 1 (only a single memory cell 1 is shown in FIG. 1 for simplicity). A symbol W indicates a word line, and symbols D and D indicate a pair of data lines. On a path 27 between a power source 26 and the memory cell array 23 is provided a P-channel metal oxide semiconductor field effect transistor (MOSFET) 6 as a switch for enabling cut-off of the path 27 during a stand-by state of the memory. An electric resistor 7 is also provided between the power source 26 and the memory cell array 23 in parallel with the P-channel MOSFET 6. When the P-channel MOSFET 6 is turned off and therefore the path 27 is cut off, electric current flows to the memory cell array 23 through the resistor 7 as will be described later in more detail.

Figure 2:
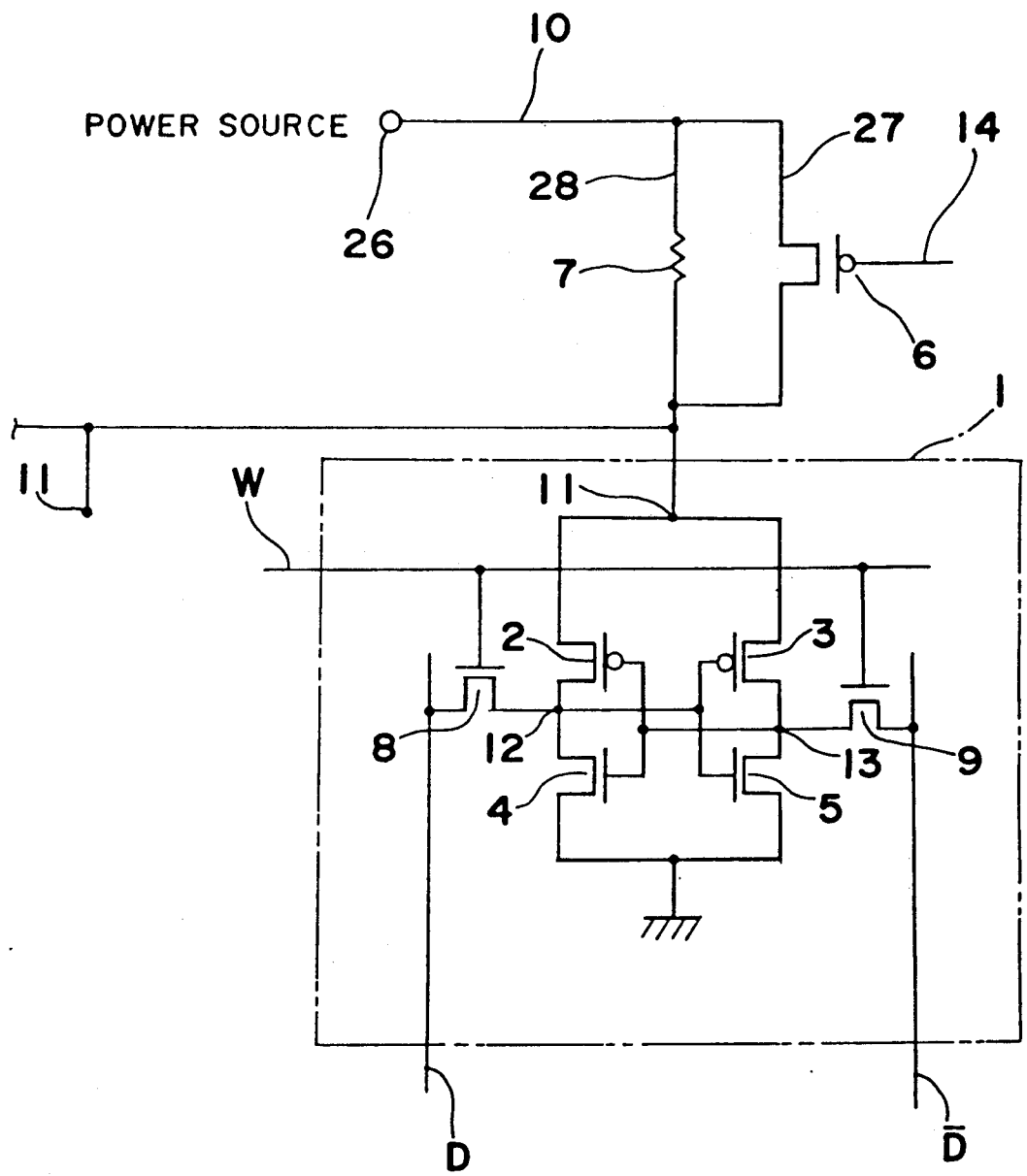
FIG. 2 is a circuit diagram of an essential part of the static RAM of FIG. 1.

As shown in FIG. 2, in each memory cell 1, which is a static-type memory cell, there are provided P-channel MOSFETs 2 and 3 and N-channel MOSFETs 4 and 5 which are respectively connected in series to the P-channel MOSFETs 2 and 3. The P-channel MOSFETs 2 and 3 are connected to each other at their respective terminals 11 on the power-source side. Both of the N-channel MOSFETs 4 and 5 are connected to ground. Gate electrodes of the P-channel MOSFET 3 and the N-channel MOSFET 5 are connected to a connection point 12 between the P-channel MOSFET 2 and the N-channel MOSFET 4. On the other hand, the gate electrodes of the P-channel MOSFET 2 and the N-channel MOSFET 4 are connected with a connection point 13 between the P-channel MOSFET 3 and the N-channel MOSFET 5. N-channel MOSFETs 8 and 9 for address selection are provided between a data line D and the connection point 12 and between the connection point 13 and the other data line D, respectively. The gate electrodes of the N-channel MOSFETs 8 and 9 are connected to the word line W.

The memory cell 1 operates as a flip-flop and outputs signals of high and low levels complementarily to the data line D connected to the connection point 12 and the data line D connected to the connection point 13.

The P-channel MOSFET 6 as a switch and the electric resistor 7 are connected in parallel between the terminal 11 of the memory cell 1 and a power supply line 10. The power supply line 10 is connected to the power source 26 and supplies a constant voltage. A gate electrode of the P-channel MOSFET 6 is supplied with a ground potential via a control line 14 so that the P-channel MOSFET 6 is turned on while the memory is in an active state. On the other hand, during a stand-by state of the memory, a power source potential is applied to the gate electrode of the P-channel MOSFET 6, so that the P-channel MOSFET 6 is turned off and the path 27 is cut off. As a result, electric current flows to the memory cell 1 via the other path 28 having the resistor 7.

As described above, when the memory cell array 23 is required to be activated, the P-channel MOSFET 6 is turned on. Thereby the constant voltage of the power supply line 10 is applied directly to the memory cells 11 and a specified electric current for activating the memory cells 1 is supplied to the memory cells 1 via the path 27 having the P-channel MOSFET 6. As a result, the static RAM of this embodiment normally operates like the conventional static RAM. On the other hand, when the memory cell array 23 is not required to be activated, the P-channel MOSFET 6 is turned off, so that the path 27 is cut off. As a result, the electric current is supplied to the memory cell array 23 via the other path 28 having the electric resistor 7. At this time, a voltage drop occurs due to the presence of the resistor 7. Because of the voltage drop, the electric current to the memory cell array 23 decreases. Accordingly, by adjusting the size of the electric resistor 7 to an appropriate value to obtain a minimum electric current for holding data in the memory cells 1, consumption of electric current can be suppressed to a minimum. Therefore, even if the static RAM of this embodiment is used in a device wherein capacity of the power source is limited, data in the memory cells 1 can be held for a long time.

In the above embodiment, only one set of the switch 6 and the electric resistor 7, which are connected in parallel, are provided. However, a plurality of the switches 6 and the electric resistors 7 may be provided between the memory cells 1 and the power source 26.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A static random access memory for storing data in a plurality of memory cells constituting a memory cell array to which a predetermined electric current is supplied from a power source via a path, comprising:
    switch means provided on the path between the power source and the memory cell array for enabling cut-off of the path when the memory is in a stand-by state; and
    an electric resistor connected between the power source and the memory cell array in parallel with said switch means and adjusted to a predetermined value for decreasing an electric current supplied to the memory cells to a minimum for holding data in the memory cells;
    whereby when the path is cut off, the electric current flows to the memory cell array via said electric resistor.

2. The static random access memory as claimed in claim 1, wherein said switch means comprises a P-channel metal oxide semiconductor field effect transistor, and when the memory cell array is required to be activated, a ground potential is applied to a gate electrode of the P-channel metal oxide semiconductor field effect transistor and when the memory cell array is not required to be activated, a power source potential is applied to the gate electrode.

3. A static random access memory for storing data in a plurality of memory cells constituting a memory cell array to which a predetermined electric current is supplied from a power source via a path comprising:
    switch means provided on the path between the power source and the memory cell array for enabling cut-off of the path when the memory is in a stand-by state, said switch means comprises a P-channel metal oxide semiconductor field effect transistor, and when the memory cell array is required to be activated, a ground potential is applied to a gate electrode of the P-channel metal oxide semiconductor field effect transistor and when the memory cell array fails to be activated, a power source potential is applied to the gate electrode; and
    an electric resistor connected between the power source and the memory cell array in parallel with said switch means;
    whereby when the path is cut off, the electric current flows to the memory cell array via said electric resistor.

* * * * *